United States Patent
Fujisaki

[11] Patent Number: 5,982,244
[45] Date of Patent: Nov. 9, 1999

[54] HIGH-FREQUENCY VOLTAGE CONTROLLED OSCILLATOR

[75] Inventor: Hirotaka Fujisaki, Neyagawa, Japan

[73] Assignee: Matsushita Electric Industrial Co., Ltd., Osaka, Japan

[21] Appl. No.: 08/176,287

[22] Filed: Dec. 30, 1993

Related U.S. Application Data

[63] Continuation of application No. 07/847,998, filed as application No. PCT/JP91/01158, Aug. 30, 1991, abandoned.

[30] Foreign Application Priority Data

Sep. 7, 1990 [JP] Japan ................................. 2-237486

[51] Int. Cl.[6] ..................................... H03B 5/18
[52] U.S. Cl. .................. 331/99; 331/117 D; 331/177 V; 331/179
[58] Field of Search ................ 331/96, 99, 107 SL, 331/117 D, 177 R, 177 V, 179; 333/223, 224, 221, 238, 246, 247, 235

[56] References Cited

U.S. PATENT DOCUMENTS

| | | | |
|---|---|---|---|
| 3,721,918 | 3/1973 | Rosen et al. | 331/99 X |
| 3,921,056 | 11/1975 | Mahoney | 331/99 X |
| 4,639,690 | 1/1987 | Lewis | 331/96 |
| 4,639,691 | 1/1987 | Iigima | 331/331 SL X |
| 4,660,002 | 4/1987 | Iijima et al. | 331/177 V X |
| 4,818,956 | 4/1989 | Stajcer | 331/107 SL X |
| 5,083,098 | 1/1992 | Alidio et al. | 331/99 |

FOREIGN PATENT DOCUMENTS

| | | |
|---|---|---|
| 2055663 | 5/1992 | Canada . |
| 54-28342 | 2/1979 | Japan . |
| 59-134904 | 8/1984 | Japan . |
| 6154704 | 3/1986 | Japan . |

*Primary Examiner*—Siegfried H. Grimm
*Attorney, Agent, or Firm*—Stevens, Davis, Miller & Mosher, L.L.P.

[57] ABSTRACT

A voltage controlled oscillator provides a trimming stub (3) for adjusting a free-running frequency in parallel to a microstrip line resonator (4). This arrangement makes it possible to easily perform fine adjustment of a free-running frequency used in the voltage controlled oscillator capable of supplying 2 GHz or higher oscillating frequency.

4 Claims, 3 Drawing Sheets

LIST OF REFERENCE NUMBERS

1 ..... INPUT TERMINAL AT WHICH A FREQUENCY CONTROLLING VOLTAGE IS APPLIED

2 ..... VARACTOR

3 ..... TRIMMING STUB FOR A FREE-RUNNING FREQUENCY

4 ..... MICROSTRIP LINE RESONATOR

5 ..... SUPPLY-VOLTAGE TERMINAL

6 ..... OUTPUT TERMINAL

7 ..... TRIMMER CAPACITOR FOR ADJUSTING A FREE RUNNING FREQUENCY

HIGH-FREQUENCY VOLTAGE CONTROLLED OSCILLATOR

This application is a continuation of application Ser. No. 07/847,998, filed Apr. 21, 1992 (abandoned), which is a 371 of PCT/JP91/01158, filed Aug. 30, 1991.

TECHNICAL FIELD

The present invention relates to a high-frequency voltage controlled oscillator which is arranged to mainly apply to communication equipment.

BACKGROUND ART

If the voltage controlled oscillator applies to communication equipment, the oscillator needs to have a function of adjusting a free-running frequency.

Two typical high-frequency voltage controlled oscillators are shown in FIGS. 2 and 3, respectively. The function of the oscillator will be described as referring to the drawings. Those voltage controlled oscillators both are a clap type. As shown, 1 is an input terminal at which a frequency-controlling voltage is applied. 2 is a varactor, 3 is a trimming stub for adjusting a free-running frequency, 4 is a microstrip line resonator, 5 is a supply-voltage terminal, 6 is an output terminal, and 7 is a trimmer capacitor for adjusting a free-running frequency.

At first, a supply voltage is applied at the terminal 5 and a voltage for controlling a frequency is applied at the terminal 1. The application of these voltages provides the varactor 2 with a constant capacitance $C_4$. At this time, the voltage controlled oscillator has an oscillating frequency represented by:

$$f = \frac{1}{2\pi}\left[\frac{1}{L_1} \times \frac{C_1C_2 + C_2C_3 + C_3C_1}{C_1C_2(C_3 + C_4) + C_3C_4(C_1 + C_2)}\right]^{1/2}$$

Hence, by adjusting the voltage applied to the varactor $C_4$, it is possible to vary the oscillating frequency. In the operation, the microstrip line resonator 4 serves as inductance $L_1$.

The frequency-controlling voltage applied at the terminal 1 has a predetermined range so that the free-running frequency is required to be adjusted according to the range. For adjusting the frequency, in the voltage controlled oscillator shown in FIG. 2, the oscillating frequency may be varied by adjusting $C_5$ with the trimmer capacitor 7, because the change of the trimmer capacitor 7 equally leads to change of $C_4$. In the voltage controlled oscillator shown in FIG. 3, on the other hand, the oscillating frequency may be varied by adjusting the length of the microstrip line with the trimming stub 3.

However, the former voltage controlled oscillator needs the trimmer capacitor 7 having a capacity for the wide range of the oscillating frequency. The critical performance of the trimmer capacitor results in limiting the realized oscillating frequency to about 1.5 GHz. Further, the latter voltage controlled oscillator has difficulty in minutely varying the frequency because the length of the microstrip line resonator 4 is adjusted by the trimming stub 3 for adjusting the oscillating frequency. The oscillator has additional difficulty in selecting one of the increase and decrease of the frequency.

To solve the difficulties, it is an object of the present invention to provide a high-frequency voltage controlled oscillator which has a trimming stub for adjusting a free-running frequency and the microstrip line resonator located in parallel to the trimming stub.

DISCLOSURE OF INVENTION

In carrying out the object, the high-frequency voltage controlled oscillator of the invention includes a trimming stub for adjusting a free-running frequency and the microstrip line resonator located in parallel to the trimming stub.

In operation, the trimming stub and the microstrip line resonator make it possible to easily perform fine adjustment of the free-running frequency so that the free-running frequency may allow the voltage controlled oscillator to supply the 2 GHz or higher oscillating frequency.

BEST MODE FOR CARRYING OUT THE INVENTION

The later description will be directed to a high-frequency power amplifier according to an embodiment of the present invention as referring to FIG. 1.

Figure 1:
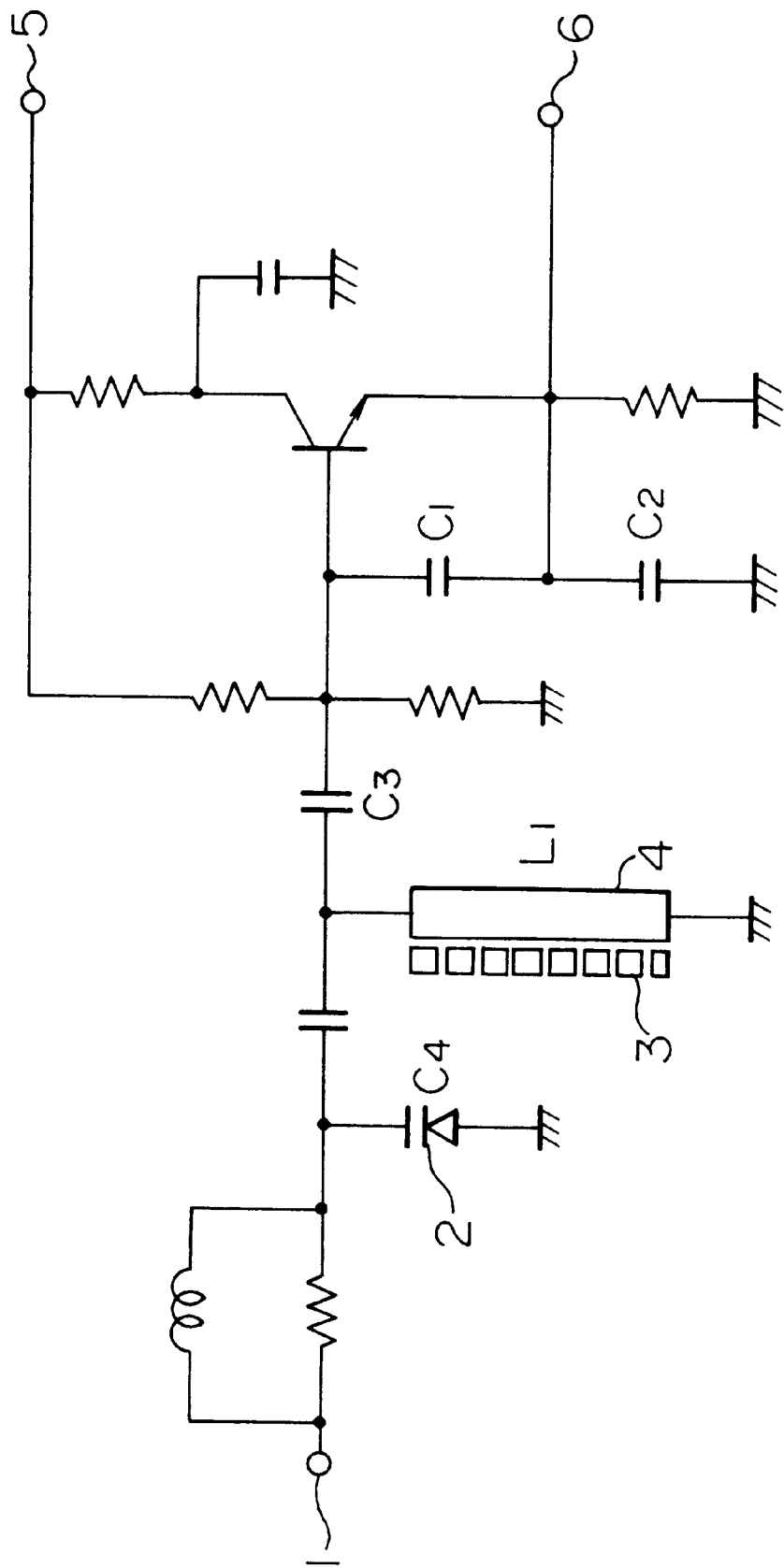
FIG. 1 is a circuit diagram showing a high-frequency voltage controlled oscillator having a microstrip line resonator according to an embodiment of the present invention.
Figure 2:
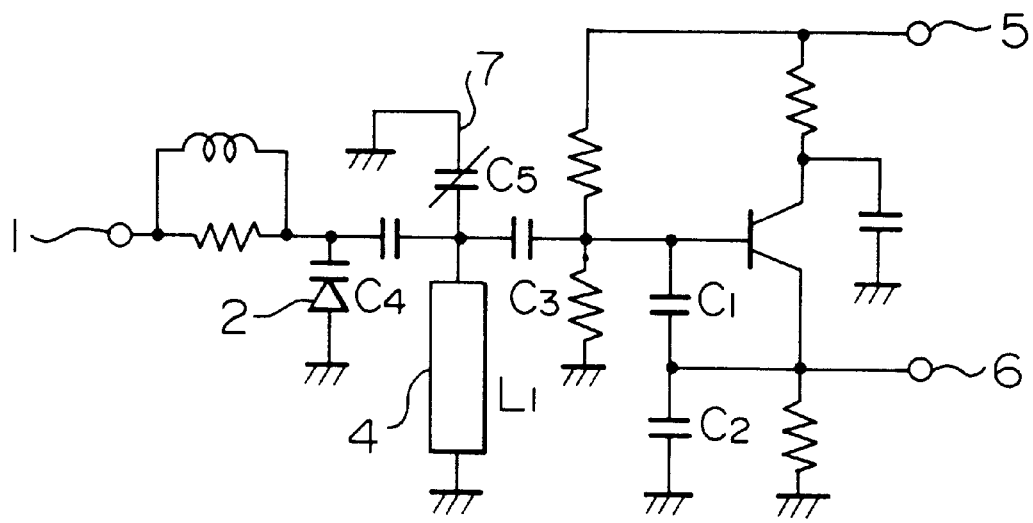
FIGS. 2 and 3 are circuit diagrams showing the conventional voltage controlled oscillators having microstrip line resonators, respectively.
Figure 3:
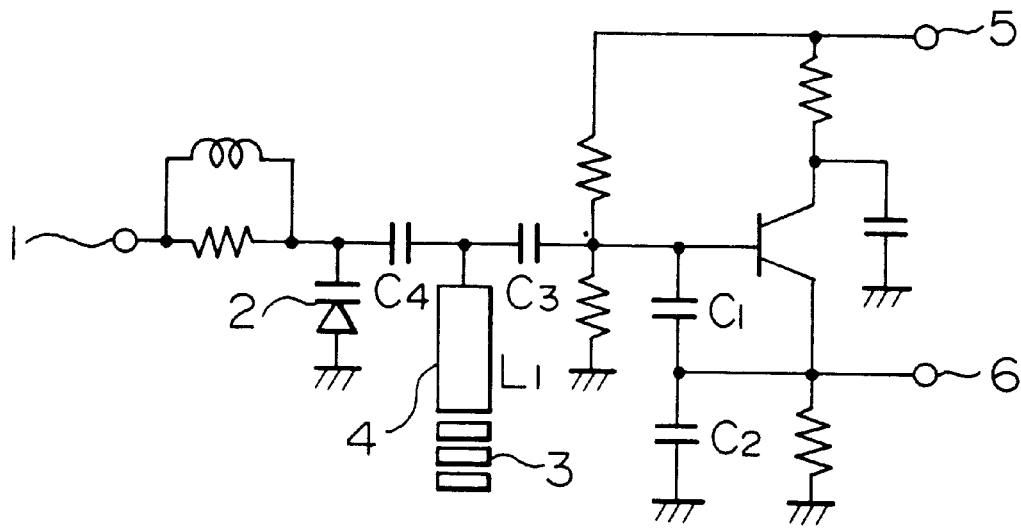

FIG. 1 shows a high-frequency voltage controlled oscillator having a microstrip line resonator according to the embodiment.

As shown in FIG. 1, the oscillating frequency is influenced by $C_1$, $C_2$, $C_3$, $C_4$ and $L_1$, which are capacitors and a microstrip line resonator. The other capacitor, resistor and coil compose a choke circuit for applying a bias voltage and a frequency-controlling voltage to a varactor 2.

As described above, the oscillating frequency is defined by the capacitors $C_1$, $C_2$ and $C_3$, the varactor 2, and the impedance of the microstrip line resonator 4.

Further, if a control voltage having a constant value for defining the free-running frequency is applied at the terminal 1, the voltage controlled oscillator is required to adjust the free-running frequency to a value corresponding to the constant value.

The microstrip line having a short-circuited tip has the impedance represented by:

$$Z_{in} = J \times Z_o \times \tan \beta l \qquad (1)$$

wherein $Z_o$ is a characteristic impedance of the microstrip line $\beta$ is $2\pi/\gamma g$, and l is a length of the microstrip line.

Hence, the expression (1) indicates that $Z_{in}$ may have an inductive impedance in the range of $0 < l < \gamma g/4$. The value of the inductance defines the free-running frequency. Hence, by minutely varying $Z_{in}$ derived by the expression (1), it is possible to perform fine adjustment of the free-running frequency.

To minutely vary the value of $Z_{in}$, as shown in FIG. 1, a trimming stub 3 is provided in parallel to the microstrip line 4. In this embodiment, the trimming stub 3 comprises a plurality of portions which are arranged in parallel with the microstrip line 4. By moving the trimming stub 3, that is, changing the location and the length of the trimming stub 3, the impedance of $Z_{in}$ is allowed to be minutely increased and decreased. This makes it possible to fine adjust the free-running frequency toward the increase or the decrease.

The embodiment shown in FIG. 1 provides the resonator having the short-circuited tip of the microstrip line. However, if the resonator has an open tip, the resonator may have the similar effect.

INDUSTRIAL APPLICABILITY

As set forth above, the high-frequency voltage controlled oscillator of the invention includes the microstrip line resonator and the trimming stub located in parallel to the resonator so that fine adjustment of the free-running frequency may be implemented. The above-mentioned arrangement of the oscillator is therefore practically advantageous.

I claim:

1. A high-frequency voltage controlled oscillator comprising:
   a capacitance circuit comprising a voltage controlled variable capacitance element, a fixed capacitance element and means for applying a control voltage to said voltage controlled variable capacitance element;
   a microstrip line serving as a resonator, said microstrip line having a first end connected to said capacitance circuit and a second end connected to ground; and
   a trimming stub for adjusting a free-running frequency, said trimming stub being provided in parallel with said microstrip line so that an oscillation frequency of said high-frequency voltage controlled oscillator is controlled in accordance with said control voltage and said free-running frequency is finely adjusted by using said trimming stub to change an inductance of said microstrip line.

2. A high-frequency voltage controlled oscillator as in claim 1, wherein said means for applying said control voltage comprises a choke circuit connected to said first end of said microstrip line, said voltage controlled variable capacitance element comprises a varactor connected to said choke circuit and said choke circuit comprises an input terminal for receiving said control voltage.

3. A high-frequency voltage controlled oscillator as in claim 2, wherein said varactor is connected to ground.

4. A high-frequency voltage controlled oscillator as in claim 1, further comprising means for changing a position and a length of said trimming stub.

\* \* \* \* \*